United States Patent
Kang et al.

(10) Patent No.: US 7,876,614 B2
(45) Date of Patent: Jan. 25, 2011

(54) MULTI-BIT FLASH MEMORY DEVICE AND PROGRAM AND READ METHODS THEREOF

(75) Inventors: Dong-Ku Kang, Gyeonggi-do (KR); Dong-Hyuk Chae, Seoul (KR); Seung-Jae Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 185 days.

(21) Appl. No.: 12/255,211

(22) Filed: Oct. 21, 2008

(65) Prior Publication Data

US 2009/0103360 A1    Apr. 23, 2009

(30) Foreign Application Priority Data

Oct. 23, 2007    (KR) .................. 10-2007-0106724

(51) Int. Cl.
*G11C 16/04* (2006.01)

(52) U.S. Cl. ........................ 365/185.03; 365/185.18

(58) Field of Classification Search ............ 365/185.03, 365/185.18
See application file for complete search history.

(56) References Cited

U.S. PATENT DOCUMENTS

| | | | |
|---|---|---|---|
| 5,652,719 A | 7/1997 | Tanaka et al. | |
| 5,696,717 A | 12/1997 | Koh | |
| 5,734,609 A | 3/1998 | Choi et al. | |
| 5,768,188 A | 6/1998 | Park et al. | |
| 5,812,454 A | 9/1998 | Choi | |
| 5,841,693 A | 11/1998 | Tsukiji | |
| 5,848,009 A | 12/1998 | Lee et al. | |
| 5,862,074 A | 1/1999 | Park | |
| 5,936,887 A | 8/1999 | Choi et al. | |
| 5,973,958 A | 10/1999 | Parker | |
| 6,137,729 A | 10/2000 | Choi | |
| 6,181,606 B1 | 1/2001 | Choi et al. | |
| 6,259,628 B1 | 7/2001 | Park | |
| 6,549,457 B1 | 4/2003 | Srinivasan et al. | |
| 6,594,178 B2 | 7/2003 | Choi et al. | |
| 6,725,321 B1 | 4/2004 | Sinclair et al. | |

(Continued)

FOREIGN PATENT DOCUMENTS

JP    2002-511655 T    4/2002

(Continued)

OTHER PUBLICATIONS

Jung et al., "A 3.3-V Single Power Supply 16-Mb Nonvolatile Virtual DRAM Using a NAND Flash Memory Technology," IEEE Journal of Solid-State Circuits, vol. 32, No. 11, Nov. 1997, pp. 1748-1757.

(Continued)

*Primary Examiner*—Tuan T. Nguyen
(74) *Attorney, Agent, or Firm*—Myers Bigel Sibley & Sajovec

(57) ABSTRACT

The flash memory device of the present invention is configured to program a plurality of bits per unit cell, wherein a program condition of a selected bit is set according to whether a program for the most previous bit to the selected bit for programming is skipped or not skipped. As a result, an accurate programming and reading operation is possible even in case a program for a middle bit is skipped.

14 Claims, 15 Drawing Sheets

U.S. PATENT DOCUMENTS

| | | | |
|---|---|---|---|
| 6,735,116 B2 | 5/2004 | Lee et al. | |
| 6,772,274 B1 | 8/2004 | Estakhri | |
| 6,813,184 B2 | 11/2004 | Lee | |
| 6,853,585 B2 | 2/2005 | Lee et al. | |
| 6,865,110 B1 | 3/2005 | Park | |
| 6,986,016 B2 | 1/2006 | Patil | |
| 7,057,942 B2 | 6/2006 | Suda et al. | |
| 7,085,909 B2 | 8/2006 | Ananthanarayanan et al. | |
| 7,120,052 B2 | 10/2006 | Shibata et al. | |
| 7,164,601 B2 | 1/2007 | Mitani et al. | |
| 7,215,580 B2 | 5/2007 | Gorobets | |
| 7,254,075 B2 | 8/2007 | Woo et al. | |
| 7,388,778 B2 | 6/2008 | Hwang | |
| 7,466,587 B2* | 12/2008 | Wang et al. | 365/185.03 |
| 7,606,069 B2* | 10/2009 | Wang | 365/185.03 |
| 2003/0086316 A1 | 5/2003 | Kurjanowicz et al. | |
| 2004/0080979 A1 | 4/2004 | Park | |
| 2005/0007801 A1 | 1/2005 | Barzilai et al. | |
| 2005/0174841 A1 | 8/2005 | Ho | |
| 2005/0246480 A1 | 11/2005 | Fu | |
| 2006/0140011 A1 | 6/2006 | Fong et al. | |
| 2006/0161723 A1 | 7/2006 | Sena et al. | |
| 2007/0106875 A1 | 5/2007 | Mather | |
| 2007/0195597 A1 | 8/2007 | Park et al. | |
| 2009/0237999 A1* | 9/2009 | Li | 365/185.12 |

FOREIGN PATENT DOCUMENTS

| | | |
|---|---|---|
| JP | 2006-139864 A | 6/2006 |
| KR | 10-0408944 B1 | 11/2003 |
| KR | 10-2004-0098642 A | 11/2004 |
| KR | 10-2005-0004142 A | 1/2005 |

OTHER PUBLICATIONS

Takeuchi et al., "A Multipage Cell Architecture for High-Speed Programming Multilevel NAND Flash Memories," IEEE Journal of Solid-State Circuits, vol. 33, No. 8, Aug. 1998, pp. 1228-1238.

Tanaka et al., "A 3.4 Mbyte/sec Programming 3-Level NAND Flash Memory Saving 40% Die Size Per Bit," 1997 Symposium on VLSI Circuits Digest of Technical Papers, pp. 65-66.

European Search Report, European Application No. 06004699.2, Sep. 1, 2006.

* cited by examiner

MULTI-BIT FLASH MEMORY DEVICE AND PROGRAM AND READ METHODS THEREOF

RELATED APPLICATION

This application claims priority to Korean Patent Application No. 10-2007-0106724, filed Oct. 23, 2007, the contents of which are hereby incorporated herein by reference.

FIELD OF THE INVENTION

The present invention is related to a semiconductor memory device, more particularly, to a multi-bit flash memory device capable of storing multi-bit data in a single memory cell, and program and read methods thereof.

BACKGROUND OF THE INVENTION

A semiconductor memory device may be sorted mainly into a volatile semiconductor memory device and a non-volatile semiconductor memory device.

The volatile semiconductor memory device processes read and write rapidly, however, has disadvantage in that the stored data expires when an external power supply is terminated. On the other hand, a non-volatile semiconductor memory device is capable of retaining data even when the external power supply is interrupted. Therefore, the non-volatile semiconductor memory device is used to store data that must be saved whether or not power supply is interrupted. Examples of non-volatile semiconductor memory devices include a mask read-only memory (MROM), a programmable read-only memory (PROM), an erasable programmable read-only memory (EPROM), and an electrically erasable programmable read-only memory (EEPROM).

In general, a MROM, PROM and EPROM have systems that writing and deleting is relatively inconvenient for a general user to retrieve the stored data. However, as writing and deleting electrically is possible in an EEPROM, its application is extended to use in system programming which consistent renewal is required and in supplementary memory device. Particularly, a flash EEPROM may be applied to use as a large-capacity supplementary memory device as it is more highly integrated than a conventional EEPROM. Among flash EEPROMS, a NAND-type flash EEPROM (NAND-type flash memory, hereinafter) is especially highly integrated compared to other flash EEPROMs.

In a flash memory device, the data state which is capable of being stored in each memory cell is determined corresponding to the number of bit stored in each memory cell. A memory cell in which 1-bit data is stored in a single memory cell is called a single-bit cell or a single-level cell (SLC). And a memory cell in which a multi-bit data (e.g. more than 2 bits) are stored in a single memory cell is called a multi-bit cell, multi-level cell (MLC), or a multi-state cell. Recently, as demand for higher integration is increasing, multi-level flash memory capable of storing multi-bit data in a single memory cell is in active research.

SUMMARY OF THE INVENTION

Exemplary embodiments of the present invention are related to a multi-bit flash memory device, and program and read methods thereof. In an exemplary embodiment, a method of programming a flash memory device may be configured to program a plurality of bits per unit cell, wherein a program condition of a selected bit is set according to whether a program for the most previous bit to the selected bit for programming is skipped or not skipped.

In another exemplary embodiment, a method of programming a flash memory device may be configured to program a plurality of bits per unit cell, and a read voltage of a selected bit is set according to whether a program for the most previous bit to the selected bit for programming is skipped or not skipped.

In yet another exemplary embodiment, a flash memory device may comprise: an array of memory cells configured to program a plurality of bits per cell; and a control circuit configured to set a program condition for a bit to be programmed according to whether the program for the most previous bit to the bit to be programmed at the cell is skipped or not skipped.

In another exemplary embodiment, a memory system may comprise: a flash memory device; and a memory controller configured to control the flash memory device, wherein the flash memory device includes a flash memory device described in claim 15.

In another exemplary embodiment, a computing system may comprise: a host; a flash memory device; and a memory controller configured to control the flash memory device according to request from the host, wherein the flash memory device includes a flash memory device described in claim 15.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
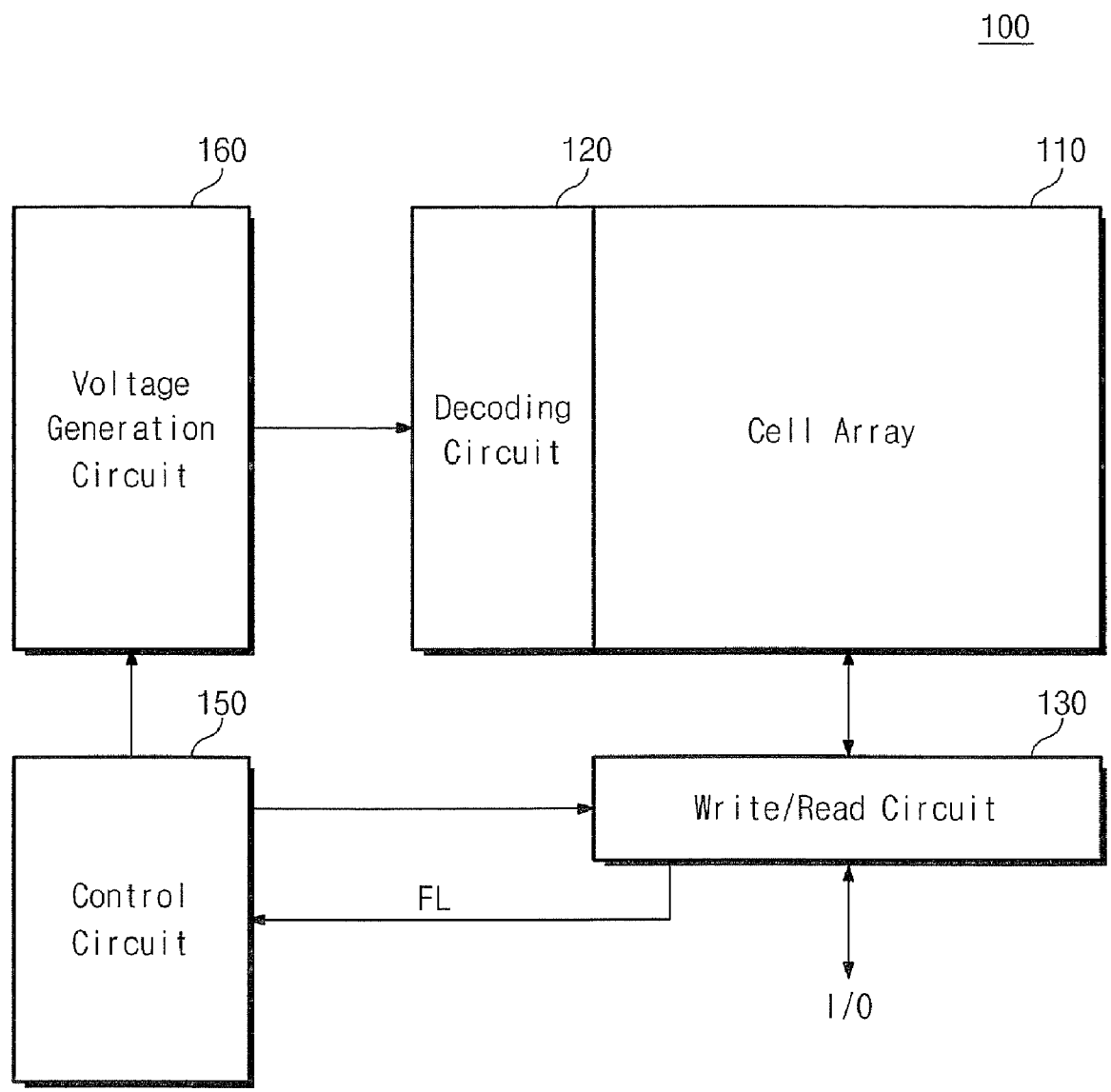
FIG. 1 illustrates a flash memory device according to the present invention.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Figure 2:
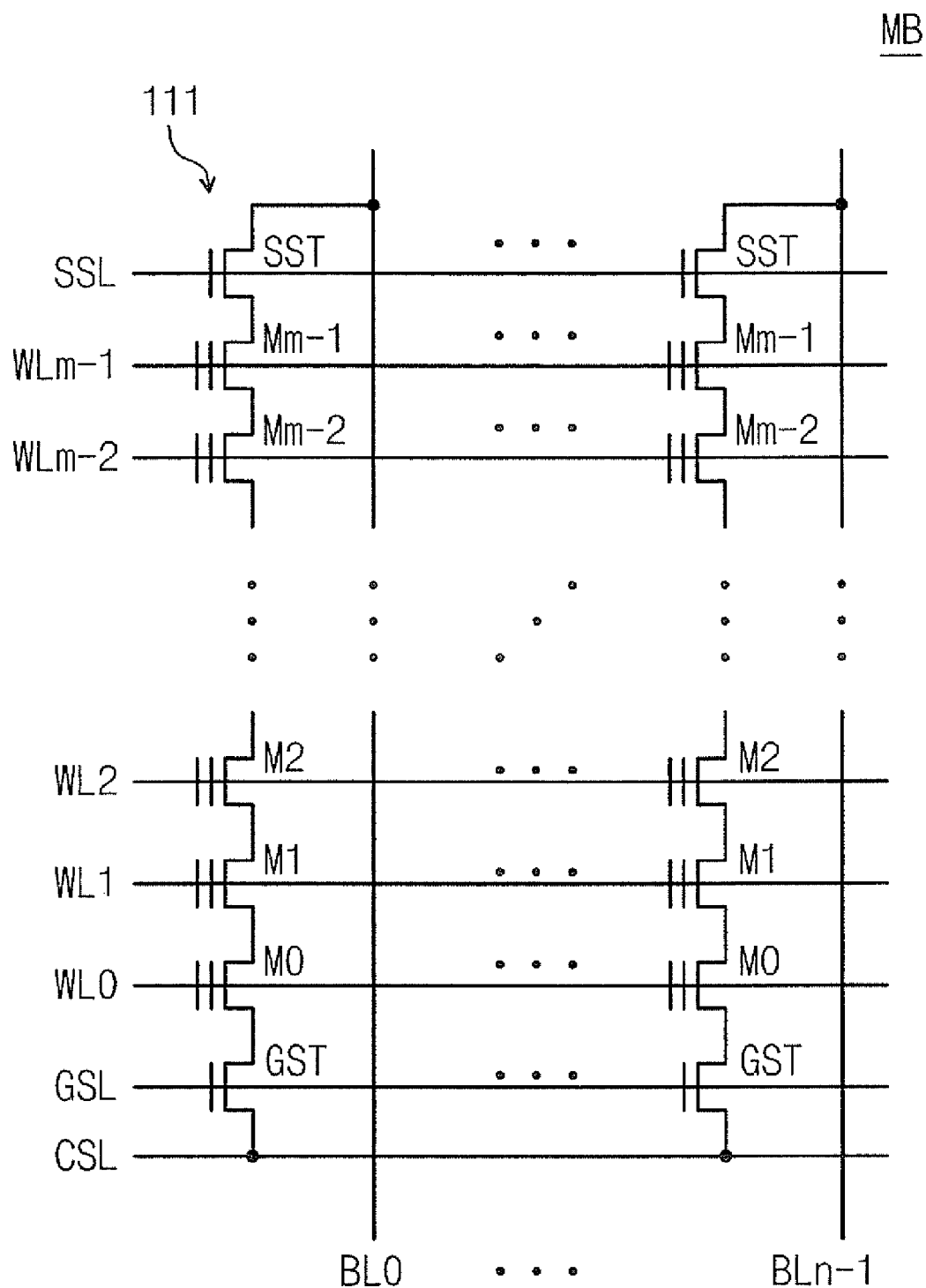
FIG. 2 and FIG. 3 illustrate examples of configuration of the cell array of FIG. 1.
Figure 3:
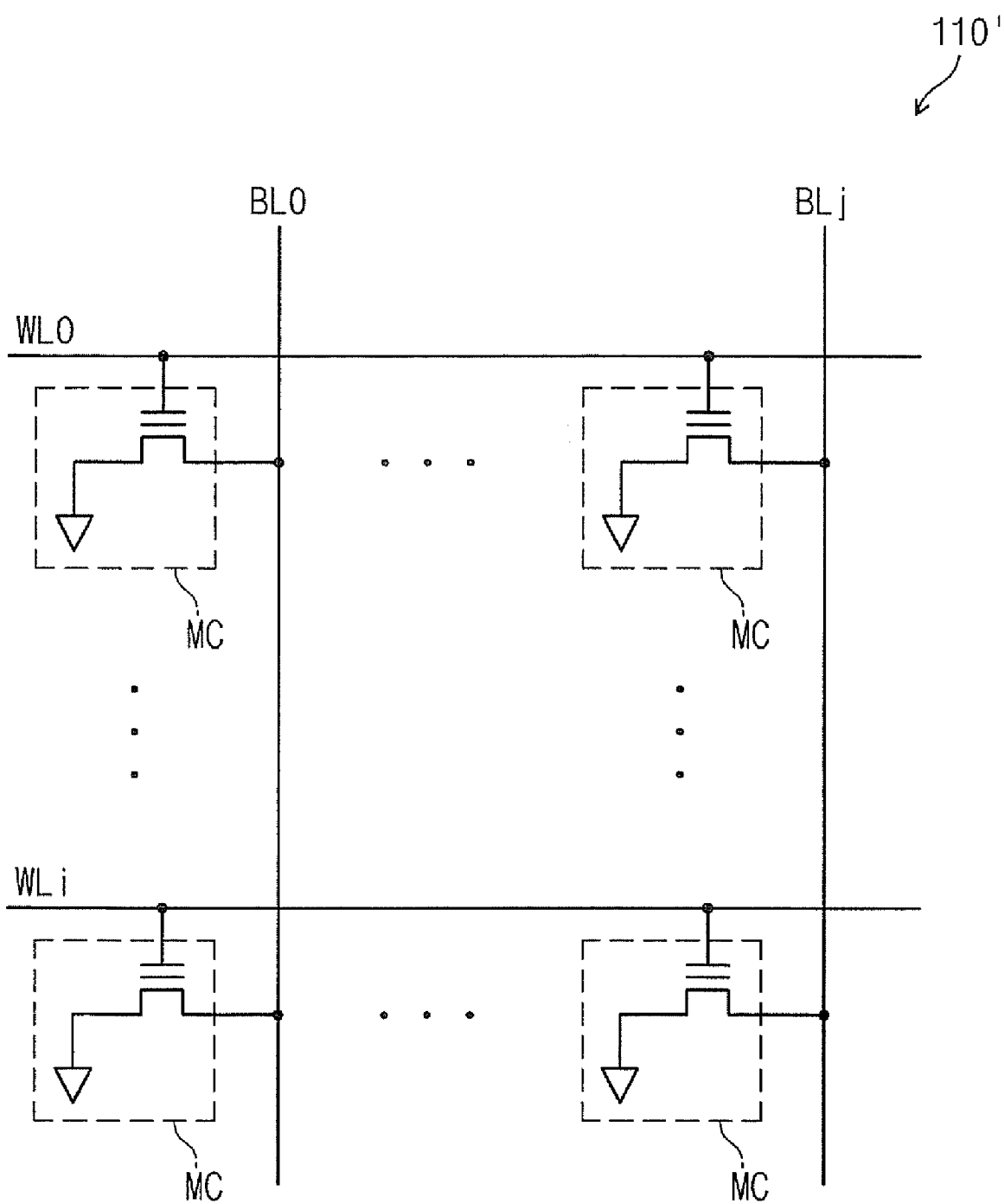

FIG. 1 illustrates a flash memory device 100 according to the present invention. FIG. 2 and FIG. 3 illustrate examples of configuration of cell array 110 illustrated in FIG. 1.

Referring to FIGS. 1, 2 and 3, the flash memory device 100 of the present invention includes a memory cell array 110 which stores N-bit data information (N equals to 1 or a larger positive number). A memory cell which stores N-bit data information per cell is called a multi-level cell (MLC). The memory cell array 110 may include a main region for storing general data, and a spare region for storing additional information (for example, flag information, error correction code, device code, maker code, and page information). N-bit data may be stored in the main region, and 10 bit data or N-bit data may be stored in the spare region.

The cell array 110 includes memory cells arrayed with a plurality of rows (or word lines) and a plurality of columns (or bit lines). The plurality of memory cells included in the cell array 110 configure a plurality of memory blocks (MBs). Memory cells included in each of the memory blocks may have a NAND string structure as illustrated in FIG. 2, or may have a NOR structure as illustrated in FIG. 3. As will be described in detail, the operational characteristic of the flash memory device 100 of the present invention may be applied to all of the NAND-type memory cells of FIG. 2 and NOR-type memory cells of FIG. 3. In addition, the operation characteristic of the flash memory device 100 of the present invention may not only be applied to the flash memory device in which a charge storage layer consists of conductive float gate, but also to charge trap flash (CTF) in which the charge storage layer consists of insulation layers.

In the present invention, a multi-level cell (MLC) flash memory having a NAND-type string structure will be described as an example where the present invention may be applied. However, it shall be obvious to persons having ordinary skill in the art that the flash memory to be described is not limited to a specific form, or program or read characteristic of the flash memory of the present invention, nor limited to the flash memory cells illustrated in FIG. 2.

Referring to FIG. 2, a memory block MB includes a plurality of strings 111 configured to correspond to a plurality of columns or bit lines $BL_0$-$BL_{n-1}$, respectively. Each of the strings 111 includes a string selection transistor SST, a plurality of memory cells $M_0$-$M_{m-1}$, and ground selection transistor GST. In each string 111, a drain of the string selection transistor SST is connected to a corresponding bit line, and a source of the ground selection transistor GST is connected to a common source line CSL. A plurality of memory cells $M_0$-$M_{m-1}$ are connected in series between the source of the string selection transistor SST and the drain of the ground selection transistor GST. Control gates of memory cells arrayed in the same row are connected in common with corresponding word lines $WL_0$-$WL_{m-1}$. The string selection transistor SST is controlled by a voltage supplied through the string selection line SSL, and the ground selection transistor GST is controlled by a voltage supplied through the ground selection line GSL. The memory cells $M_0$-$M_{m-1}$ are controls by a voltage supplied through corresponding word lines $WL_0$-$WL_{m-1}$. The memory cells connected to each of the word lines $WL_0$-$WL_{m-1}$ store data equivalent to a page or a number of pages.

Program or read operation of a NAND-type flash memory is performed in units of a page, and delete operation of a programmed data is performed in units of a block which consists of a number of pages. Information related to program operation or delete operation of each of the pages is stored in flag cells allotted to spare region (or a portion of the main region). This is called flag information (FL). In case of a multi-level cell in which N-bit data is stored per cell, a program operation for each of the bits may be performed independently up to N times maximum. A program operation for each bit of the multi-level cell is performed in page units at the cells connected to the same word lines $WL_0$-$WL_{m-1}$. Page program information (flag information FL, hereinafter) corresponding to each of the bits are stored independently in each corresponding flag cell. The flag cell may consist of the multi-level cell MLC and/or the single-level cell SLC having identical structure with the NAND string structure of FIG. 2. And the flag cell may be formed in the spare region of the cell array 110, or formed in the main region of the cell array 110. The form and number of the flag cells may be varied according to structures of the cell array 110.

Referring back to FIG. 1, a control circuit 150 controls all operations related to program, delete and read operation of the flash memory 100. The data to be programmed is loaded at an write/read circuit 130 through a buffer (not shown) according to control at the control circuit 150. During the interval while the memory cell is being programmed, the control circuit 150 controls a decoding circuit 120, a voltage generation circuit 160, and the write/read circuit 130, so as to respectively supply program voltage Vpgm to selected word line, pass voltage Vpass to non-selected word lines, and 0V voltage to a bulk in which memory cells are formed. The program voltage Vpgm is generated according to incremental step pulse programming (ISPP). The level of the program voltage Vpgm increases step by step, as much as predetermined voltage gain ($\Delta V$) each time, as program loops are repeated. A number of supply of the program voltages Vpgm, voltage level, and voltage supply period used in each program loop may be varied and modified in various forms according to the external (e.g. memory controller) or internal (e.g. control circuit 150) control. Particularly in the present invention, level of a program voltage for a current bit and a level of read voltage corresponding to the program voltage are adjusted based on program progress state for the previous bit. The program progress state for each bit may be verified by using the flag information FL. The flag information is used to provide information on program for which $n^{th}$ bit is performed in the selected memory cell, or a program operation for which $n^{th}$ bit is skipped.

In FIG. 1, the voltage generation circuit 160 generates word line voltages (e.g. program voltage Vpgm, read voltage Vread, or pass voltage Vpass) to be provided to each of the word lines, and voltage to be provided to the bulk (e.g. well region) in which memory cells are formed. The voltage generation operation of the voltage generation circuit 160 is performed by control at the control circuit 150. The decoding circuit 120 responds to control at the control circuit 150 to select one of the memory blocks (or sectors) of the memory cell array 110, and to select one of the word lines of the selected memory block. The decoding circuit 120 responds to the control at the control circuit 150 to provide word line voltage generated from the voltage generation circuit 160 to the selected word line and non-selected word lines, respectively.

The write/read circuit 130 is controlled by the control circuit 150, and operates as sense amplifier or as write driver according to operation mode. For example, in case of verification/normal read operation, the write/read circuit 130 operates as a sense amplifier for reading data from the memory cell array 110. In case of a normal read operation, the data read from the write/read circuit 130 is output externally (e.g. a memory controller or a host). And the data read during verification/read operation is provided to a pass/fail verification circuit (not shown).

In case of a program operation, the write/read circuit 130 operates as a write driver which drives bit lines according to the data to be stored in the memory cell array 110. The write/read circuit 130 receives input of the data to be used at the memory cell array 110 during a program operation from the buffer, and drives bit lines according to the input data. In order to operate this, the write/read circuit 130 may consist of a plurality of page buffers (not shown) corresponding to columns (or bit lines) or column pairs (or bit line pairs), respectively. A program operation and read operation performed by the write/read circuit 130 respond to control at the control circuit 150 to independently operate for each bit configuring the multi-level cell MLC. In this case, a program/read voltage to be used in program/read operation may be varied according to whether program for the previous bit is performed or not, before the present bit to be programmed/read.

Figure 4:
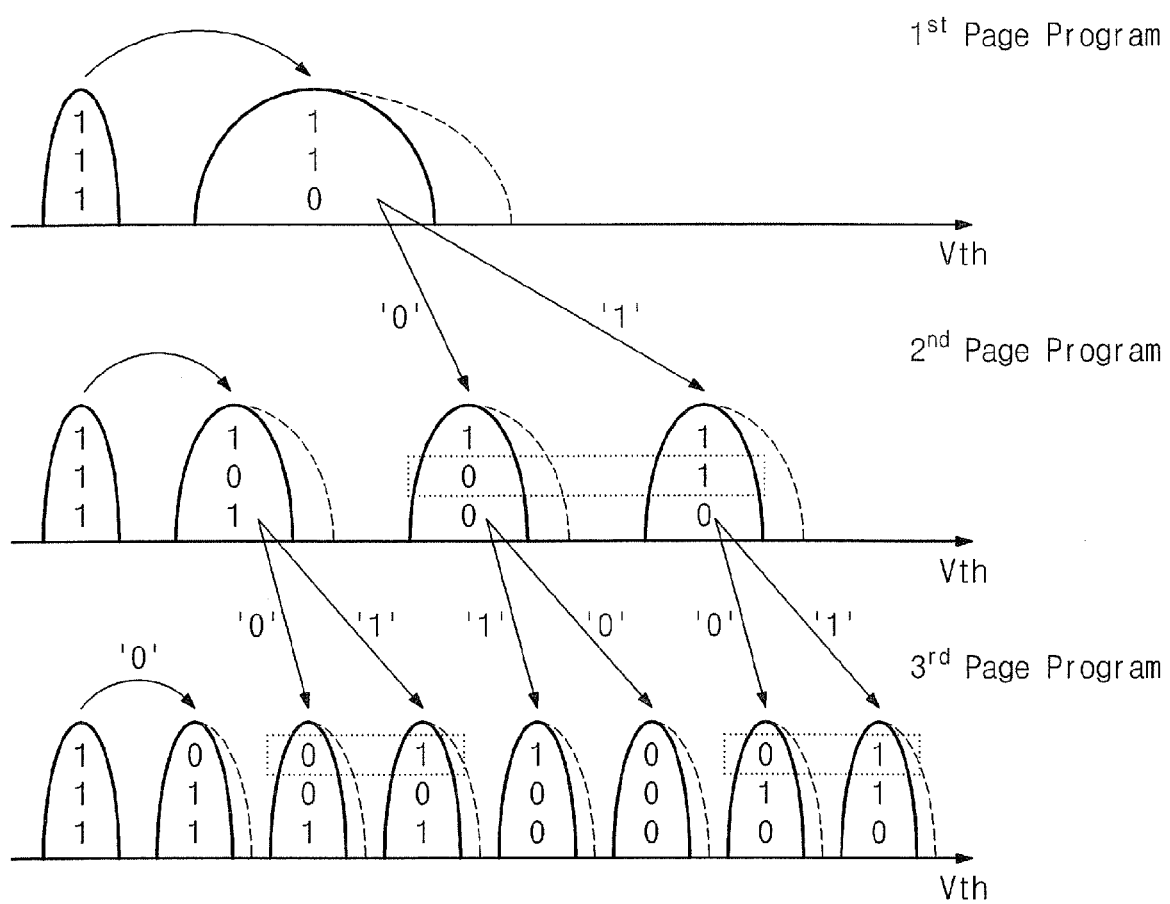
FIG. 4 illustrates a program state dispersion of the flash memory cell of FIG. 2.

FIG. 4 illustrates a program state dispersion of a flash memory cell of FIG. 2. It is an example of the program state dispersion of a 3-bit multi-level cell. However, this is an example in which the present invention may be applied, and the dispersion of program state illustrated in FIG. 4 may be defined in other forms.

Referring to FIG. 4, N-bits (e.g. 3-bits) may be stored in a single memory cell, and each bit may be programmed independently through page program operation which is also performed independently. Here, independent page program algorithm may be applied to each page program operation that corresponds to each bit. Each page program algorithm signifies program algorithm that is applied to each program loop at an ISPP program algorithm.

For example, program for a $1^{st}$ bit (i.e. least significant bit; LSB) may be performed by the first page program algorithm. In the first page program algorithm, only the least significant bit value is programmed as "1" or "0", according to the data value loaded at the page buffer. Here, 2 of the upper bits maintain deleted states (i.e. "11"). As a result, the memory ell obtains one of either a data state of "111" or a data state of "110", through the first page program algorithm. The memory cell in the "111" state means a deleted state, and a threshold voltage of the memory cell in the "110" state means a cell that is programmed to be higher than the threshold voltage of the memory cell in the "111" state.

A program for a $2^{nd}$ bit may be performed through a second page program algorithm. In the second page program algorithm, only the value of $2^{nd}$ bit of the memory cell selected according to the data value loaded in the page buffer is programmed as "1" or "0". Here, the $1^{st}$ bit value and a $3^{rd}$ bit value maintain the previous states. In other words, in the memory cell in the "111" state, only the $2^{nd}$ bit value may be programmed as "1" or "0" by the program algorithm, to be transitioned into either one of the program state of "111" or "101". The memory cell in the "110" state has the $2^{nd}$ bit value to be programmed as "1" or "0", to be transitioned into either one of the program state of "100" or "110".

Subsequently, a program for a $3^{rd}$ bit (i.e. most significant bit; MSB) may be performed through a third page program algorithm. In a program algorithm for the $3^{rd}$ bit, only the $3^{rd}$ bit value of the memory cell selected according to a data value loaded at the page buffer is programmed as "1" or "0". Here, the $1^{st}$ bit value and the $2^{nd}$ bit value maintain the previous states. As a result, the memory cell is programmed to be one of "111", "011", "001", "101", "100", "000", "010" or "110".

A page address allotted during a program operation, may be allotted successively in word line direction, or may be allotted not successively. The page address allotted internally is determined internally according to frequency of use of the selected memory cell. Such page addressing method may be applied not only to a single-level flash memory device but also to multi-level flash memory device. In case of a multi-level cell in which a plurality of data bits are stored, each of page addresses used for programming each of the data bits may be allotted independently from other data bits.

Figure 5:
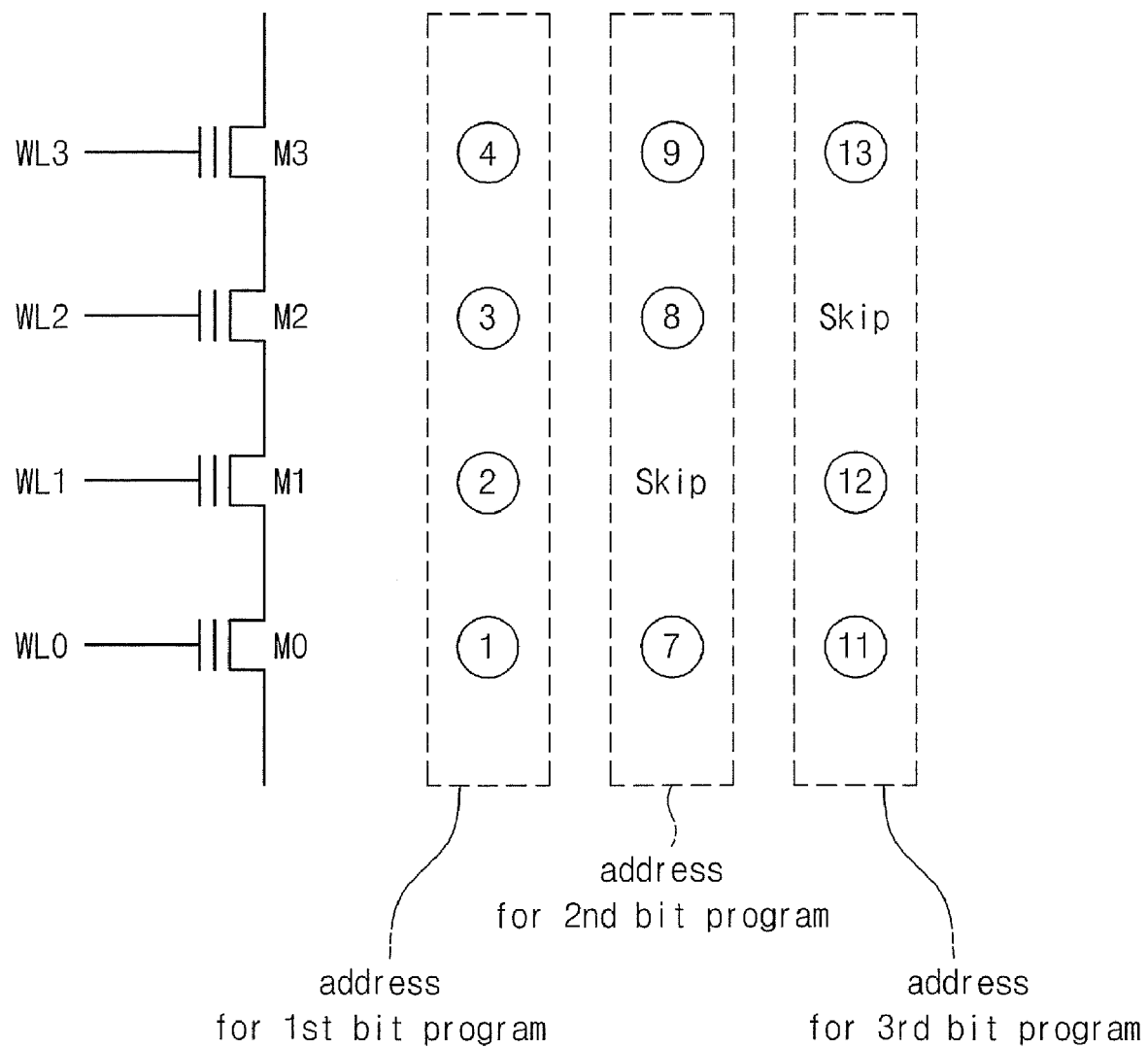
FIG. 5 illustrates an example of page address allotment result for each bit of the flash memory cell of FIG. 2.

FIG. 5 illustrates an example of page address allotment result for each bit of the flash memory cell of FIG. 2.

Referring to FIG. 5, page addresses may be allotted sequentially, which are to be used in program from the least significant bit (LSB) to the most significant bit (MSB) in each of the flash memory cell, during the program operation. In this case, a page address may be designated, the page address configured to program $i+1^{th}$ bit at a selected memory cell, in the condition that i or a smaller bit than i is programmed at the adjacent memory cell. However, according to the page address allotment condition, page address allotment for a middle bit may be skipped at some memory cells, as illustrated in FIG. 5. The skipping of the address allotment leads to skipping of program operation for the corresponding bit of the corresponding memory cell.

Referring to FIG. 5, a total of 3 addresses may be allotted in memory cells M0 and M3, ranging from an address configured to program the $1^{st}$ bit to an address configured to program the $3^{rd}$ bit. In the memory cells M0 and M3, the 3 bits from the $1^{st}$ bit to the $3^{rd}$ bit will be sequentially programmed. In this case, the program state dispersion will be same as the program state transition result of the first to third page program algorithms illustrated in FIG. 4. In a memory cell M2, an address configured to program the $3^{rd}$ bit may be not allotted and only addresses configured to program the $1^{st}$ and $2^{nd}$ bits may be allotted. Therefore, only the $1^{st}$ bit and $2^{nd}$ bit will be sequentially programmed in the memory cell M2. In this case, the program state dispersion will be the same as the program state transition result of the first and second program algorithms illustrated in FIG. 4. In other words, in case the program for the most previous bit of the plurality of bits configuring the multi-level cell, is not skipped (e.g. in case of memory cells M0, M3, and M2), the program state dispersion will be the same as the program state transition result illustrated in FIG. 4.

However, in a memory cell M1, an address configured to program the $2^{nd}$ bit may be not allotted, but only the addresses configured to program the $1^{st}$ and $3^{rd}$ bits may be allotted. In this case, the program for the $2^{nd}$ bit will be skipped, and a program for the $3^{rd}$ bit will be performed after the $1^{st}$ bit is programmed in the memory cell M1. The program operation for each bit is closely related to the program state for the most previous bit. If a program for the $3^{rd}$ bit is performed without considering the skipped $2^{nd}$ bit program, it may cause to vary the program states of FIG. 4 from a desiring form to a non-desiring form. This means some problems may be occurred during the $3^{rd}$ bit program if not considering the skipped $2^{nd}$ bit program. More briefly, if the program for the (i+1)th bit (e.g., $3^{rd}$ bit) is performed without considering the skipped ith bit (e.g., $2^{nd}$ bit) program, one or more LSB (Least Significant Bits) data bits (e.g., data bit of $1^{st}$ bit or $2^{nd}$ bit) of the memory cell may be changed from "1" to "0" or from "0" to "1" during the (i+1)th bit (e.g., $3^{rd}$ bit) program. This makes changes for threshold voltage distributions and/or corresponding program states into not desired form. Therefore, program errors may be occurred in the (i+1)th bit (e.g., $3^{rd}$ bit) program operation if it does not consider the skipped ith bit (e.g., $2^{nd}$ bit) program in the (i+1)th bit (e.g., $3^{rd}$ bit) program. To prevent above described problems, the present invention provides a new method of program voltage and/or reading in which the program state dispersion does not vary (or which the transition of the program state can be accurately reflected to read operation), even in case the program operation for the middle bit is skipped. The program methods and reading methods according to exemplary embodiments of the present invention are as follows.

Figure 6:
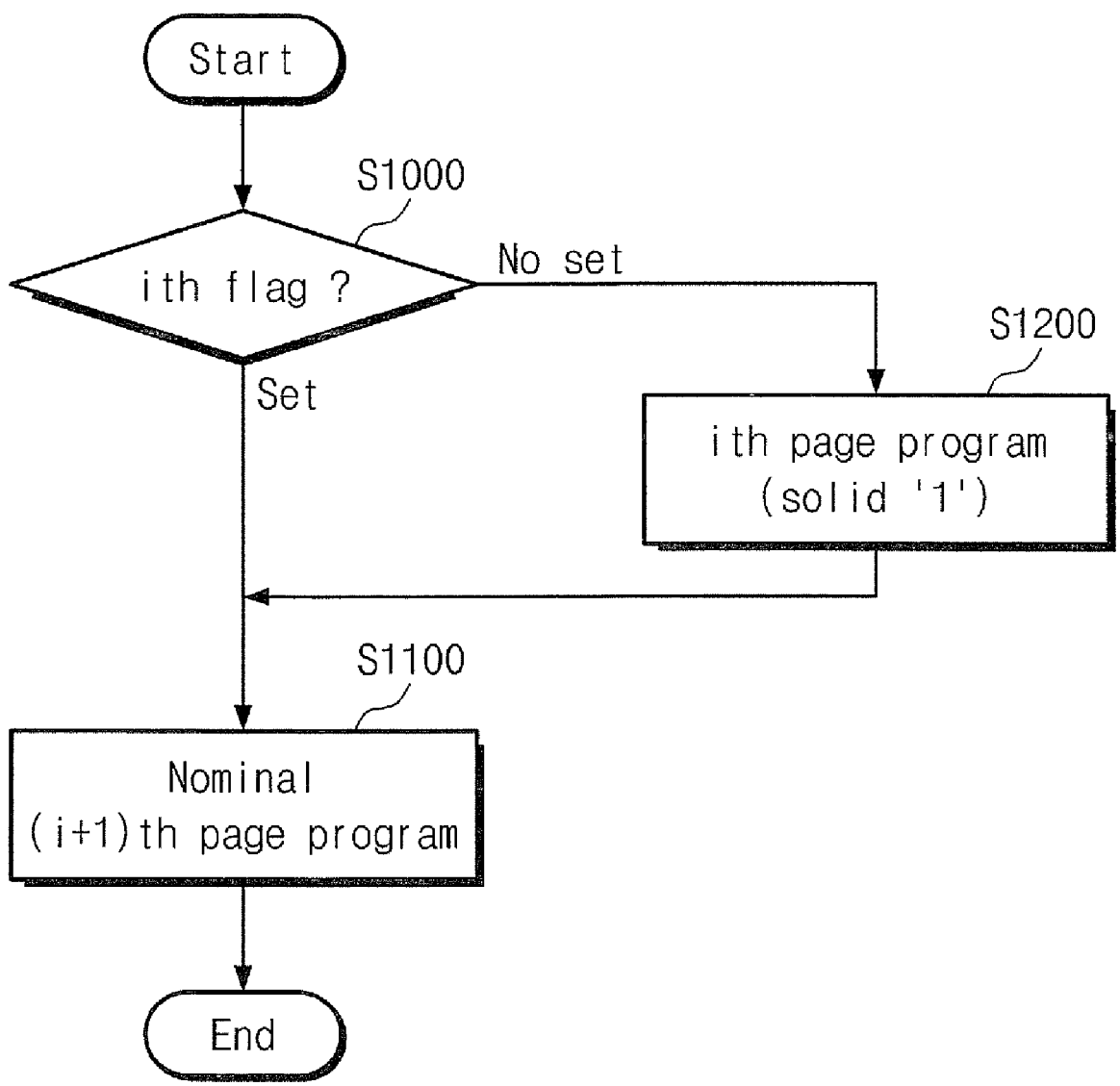
FIG. 6 is a flow chart illustrating a programming method according to a first embodiment of the present invention.
Figure 7:
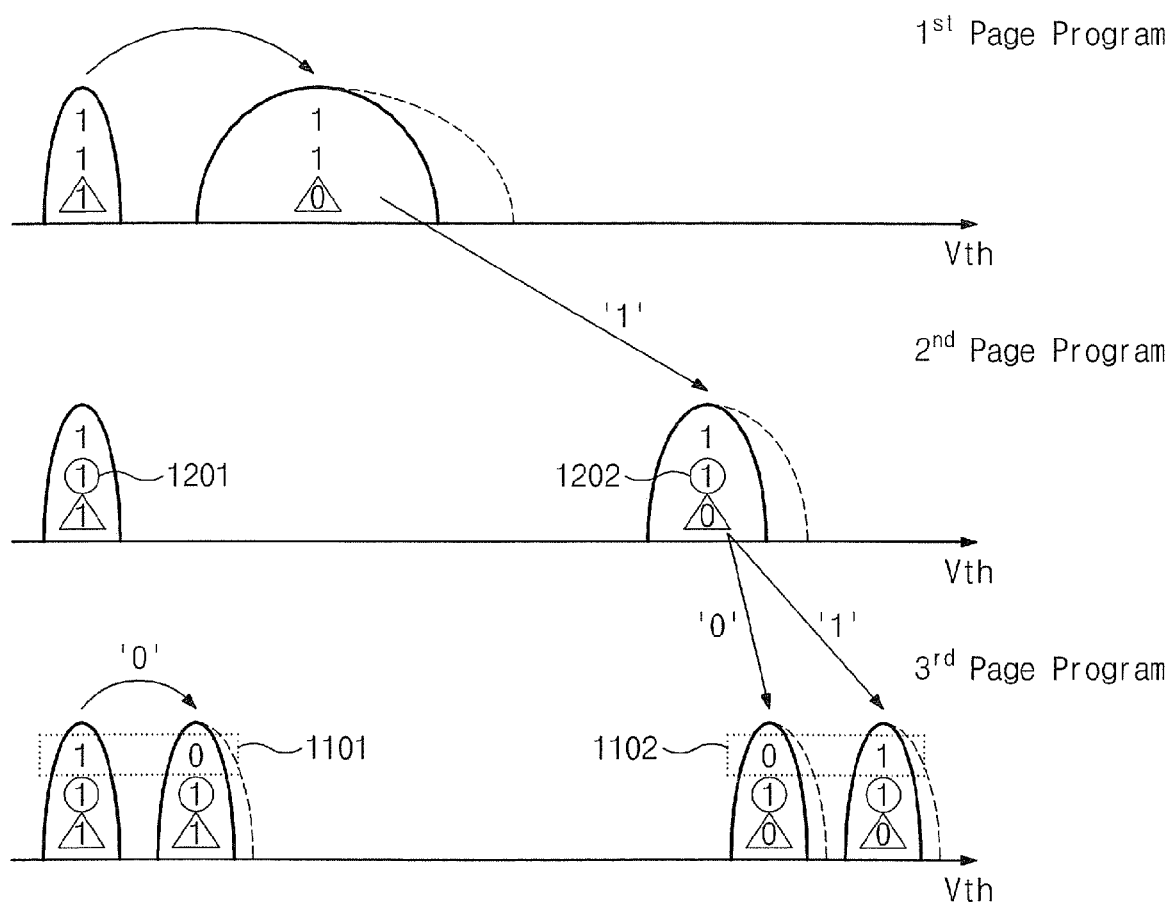
FIG. 7 illustrates a transition of program state according to method of program of FIG. 6.

FIG. 6 is a flow chart illustrating a programming method according to a first embodiment of the present invention. FIG. 6 illustrates an example of a method of programming a $(i+1)^{th}$ bit according to whether program of the $i^{th}$ bit is performed or not performed in a multi-level cell. FIG. 7 illustrates a transition in a program state according to a program method of FIG. 6. FIG. 7 is an example of transition in program state for a $3^{rd}$ bit according to the first embodiment of the present invention, in case the program of a $2^{nd}$ bit of a 3 bit multi-level cell is skipped. Program and read characteristics which will be described below are not limited to a 3-bit multi-level cell, but may also be applied to other various forms of multi-level cells.

Referring to FIG. 6, the method of programming a flash memory device according to the present invention is to initially check a state of a flag cell that corresponds to an $i^{th}$ bit (e.g. $2^{nd}$) of the selected memory cell, when performing a program for $(i+1)^{th}$ bit (S1000). Flag information FL is stored in the flag cell and indicates whether the $i^{th}$ bit is programmed (i.e. indicates whether an $i^{th}$ page program algorithm is performed). For example, in case the $i^{th}$ bit of the selected memory cell is programmed, the flag information FL will be set at a predetermined value (e.g. '1' or '0') in the corresponding flag cell. If the $i^{th}$ bit of the selected memory cell is not programmed, the flag information FL will not be set in the corresponding flag cell.

As a result of identification at S1000, if the flag information FL corresponding to the $i^{th}$ bit of the selected memory cell is set at a predetermined value, a $(i-1)^{th}$ (e.g. $3^{rd}$) page program algorithm is performed (S1100). At S1100, ISPP program conditions for a normal $(i+1)^{th}$ page program algorithm (e.g. level of program voltage Vpgm, number of program voltage Vpgm supplied, voltage increment (ΔV), period of program voltage supplied) are applied. In this case, the program operation for a middle bit is not skipped. Therefore, the program state transitions of the $(i+1)^{th}$ bit correspond to the program states of the $(i+1)^{th}$ bit illustrated in FIG. 4 as a desiring form.

As a result of identification at S1100, if the flag information FL corresponding to the $i^{th}$ bit (e.g. $2^{nd}$) of the selected memory cell is not set at a predetermined value, an $i^{th}$ page program algorithm that programs the $i^{th}$ bit of the selected memory cell into '1' is performed (S1200). In other words, in the step S1200, a data value of '1' is programmed uniformly for the $i^{th}$ bit of the selected memory cells, without regard to the data value to be programmed. In the step S1200, ISPP program condition for $i^{th}$ page program algorithm is applied. The ISPP program condition may be varied or modified into various forms according to external (e.g. memory controller) or internal (e.g. control circuit 150) control. The transition of program state of the $i^{th}$ bit obtained from program operation performed at the step S1200 equals to 1201 and 1202 shown in FIG. 7. Subsequently, the procedure is moved onto step S1100 to perform a normal $(i+1)^{th}$ (e.g. $3^{rd}$) page program algorithm. In the $(i+1)^{th}$ page program algorithm, the $(i+1)^{th}$ bit value of the selected memory cell is programmed to '0' or '1' according to the program data value loaded at the page buffer. The transition in program state of the $(i+1)^{th}$ bit as a result of the program algorithm performed at the step S1100 equals to 1101 and 1102 illustrated in FIG. 7. Program states of 1101 and 1102 illustrated in FIG. 7 correspond to the program states of the $(i+1)^{th}$ bit illustrated in FIG. 4 as the desiring form.

As described above, the method of programming according to the present invention is to initially verify whether a program for $i^{th}$ bit is performed prior to performing a $(i+1)^{th}$ page program algorithm. Then according to the verified result, the $(i+1)^{th}$ page program algorithm is performed normally, or after $i^{th}$ bit is programmed to '1', $(i+1)^{th}$ page program algorithm is performed. According to this programming method, the transition of the program may proceed step-by-step, and the desiring program states (e.g., FIG. 4) can be obtained without program error even in case the program for the middle bit is skipped. A rapid program state change originated from $(i+1)^{th}$ page program without considering the skipped $i^{th}$ bit program may increase an influence from charge coupling between adjacent memory cells. In order to prevent this, the programming method of the present invention is to write artificial data (i.e. 1) at the middle bit, in case the program for the middle bit is skipped. Accordingly, the program state transition may be performed step-by-step. In this programming method, influence from charge coupling may be decreased, and a program for a bit to be performed later may be performed accurately, even in the program for the middle bit is skipped. Referring to illustrated in FIG. 7, it can be seen that the program state of the $(i+1)^{th}$ bit corresponds to the program state of the $(i+1)^{th}$ bit illustrated in FIG. 4 even in the program for the middle bit is skipped. In this case, the data value programmed according to the programming method of first embodiment of the present invention, may be read without a separate voltage adjustment during a normal read operation.

Figure 8:
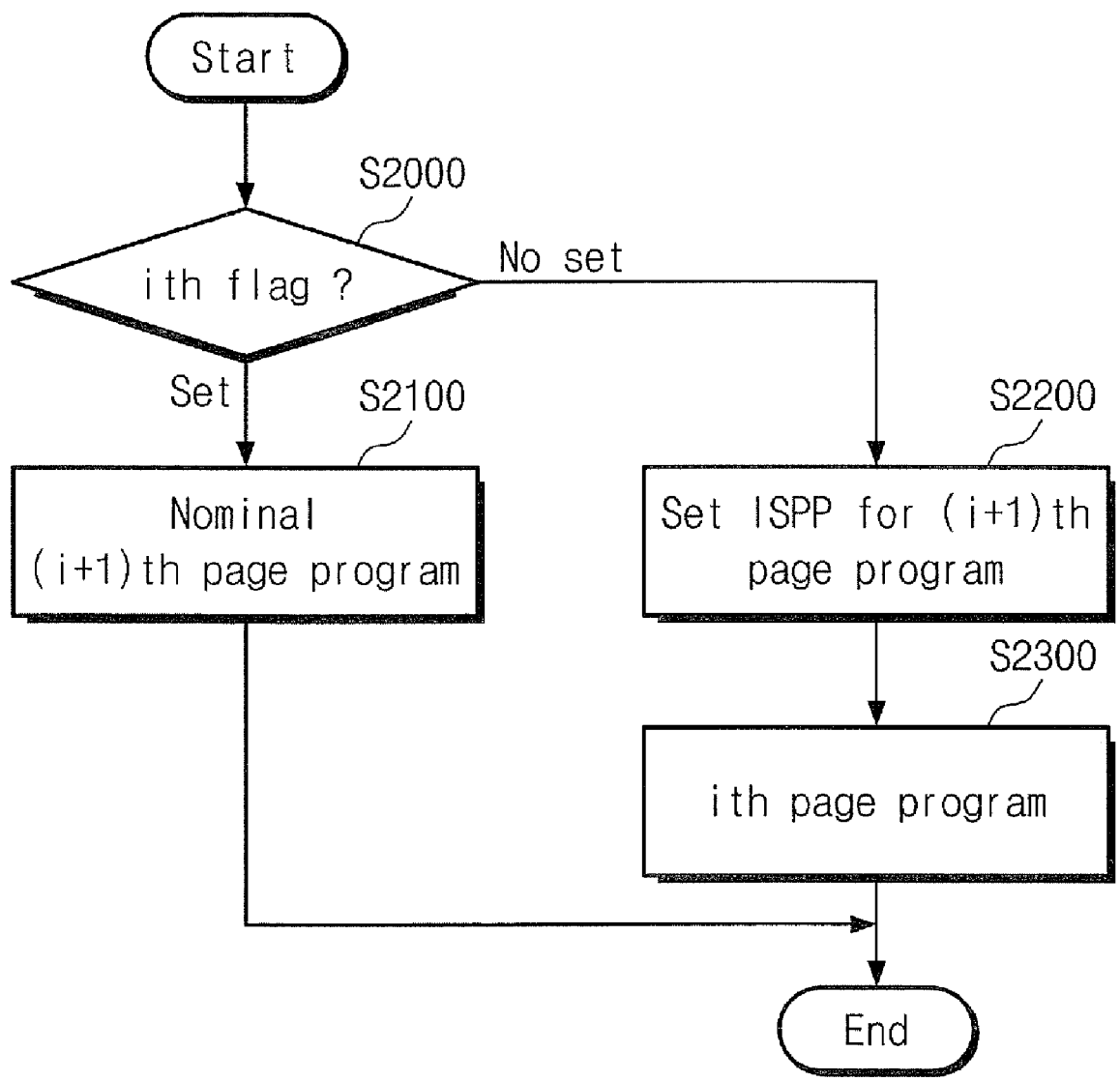
FIG. 8 is a flow chart of a program method according to a second embodiment of the present invention.
Figure 9:
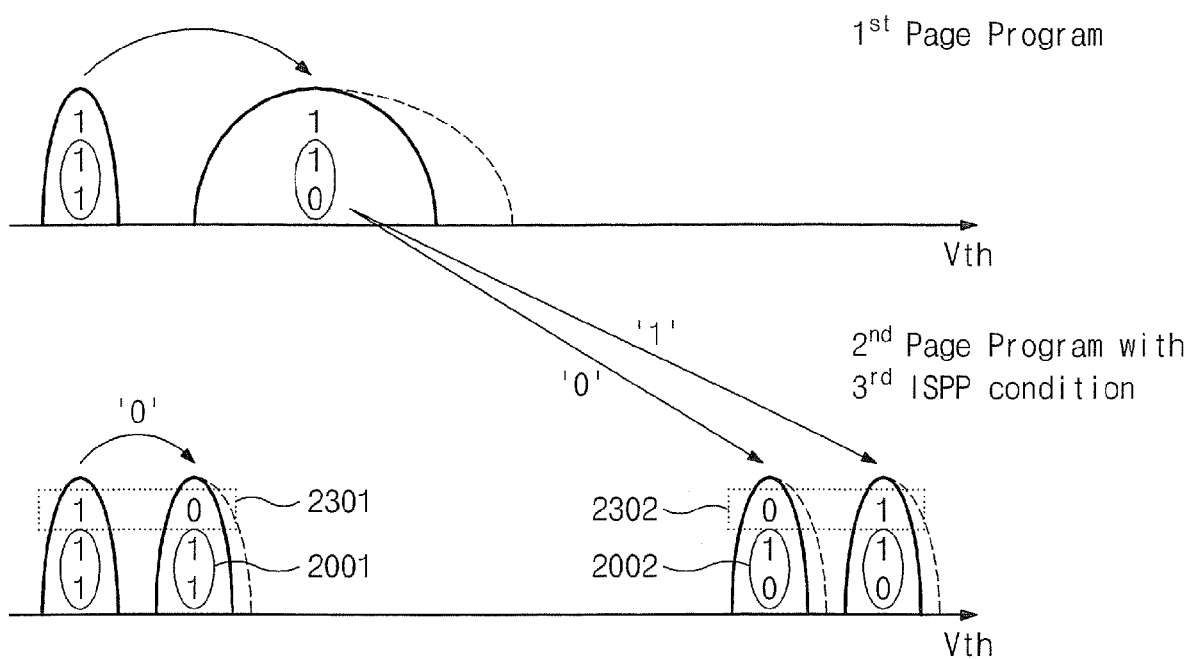
FIG. 9 illustrates a transition of program state according to method of program of FIG. 8.

FIG. 8 is a flow chart of a program method according to a second embodiment of the present invention. FIG. 8 illustrates an example of a method of programming $i+1^{th}$ bit according to whether program of the $i^{th}$ bit is performed or not performed in a multi-level cell. FIG. 9 illustrates a transition of program state according to method of program of FIG. 8. FIG. 9 is an example of transition in program state for a $3^{rd}$ bit according to the first embodiment of the present invention, in case the program of a $2^{nd}$ bit of a 3 bit multi-level cell is skipped. Program and read characteristics which will be described below are not limited to a 3-bit multi-level cell, but may also be applied to other various forms of multi-level cells.

Referring to FIG. 8, the method of programming a flash memory device according to the present invention is to initially check a state of a flag cell that corresponds to an $i^{th}$ bit (e.g. $2^{nd}$) of the selected memory cell, when performing a program for $(i+1)^{th}$ bit (S2000). As a result of identification at the step S2000, if the flag information FL corresponding to the $i^{th}$ bit of the selected memory cell is set at a predetermined value, a $(i+1)^{th}$ (e.g. $3^{rd}$) page program algorithm is performed (S2100). At the step S2100, ISPP program conditions for a normal $(i+1)^{th}$ page program algorithm are applied. In this case, the program operation for a middle bit is not skipped, therefore, the program state transitions in steps as illustrated in FIG. 4.

As a result of identification at the step S2000, if the flag information FL corresponding to the $i^{th}$ bit (e.g. $2^{nd}$) of the selected memory cell is not set at a predetermined value, the program condition is set in an ISPP program condition for the $i+1^{th}$ page program algorithm (S2200). Then the $i^{th}$ (e.g. $2^{nd}$) page program algorithm is performed by using the program condition set in the step S2200 (S2300). A data substantially programmed at the step S2300 is a $(i+1)^{th}$ bit of the selected memory cell (see 2301 and 2302 of FIG. 9), and a bit value equal to or less than the $i^{th}$ maintains the previous state (see 2001 and 2002 of FIG. 9).

As is well-known to persons in the art, a level of a program voltage Vpgm for a $(i+1)^{th}$ page program algorithm is higher than the level of a program voltage Vpgm for an $i^{th}$ page program algorithm. Therefore, the transition in program state of an $i^{th}$ page program algorithm performed in the step S2300, is higher than a transition of program state obtained from a normal $i^{th}$ page program algorithm. In other words, according to the program method of the present invention, due to the higher ISPP program condition, a $(i-1)^{th}$ program state value (e.g. $1^{st}$) is directly transitioned to a $(i+1)^{th}$ program state value (e.g. $3^{rd}$). The obtained $(i+1)^{th}$ program state value (e.g. $3^{rd}$) corresponds directly to the program state of FIG. 4. Therefore, a data value programmed according to the program operation of the second embodiment of the present invention can be read without a separate voltage adjustment during a normal read operation.

Figure 10:
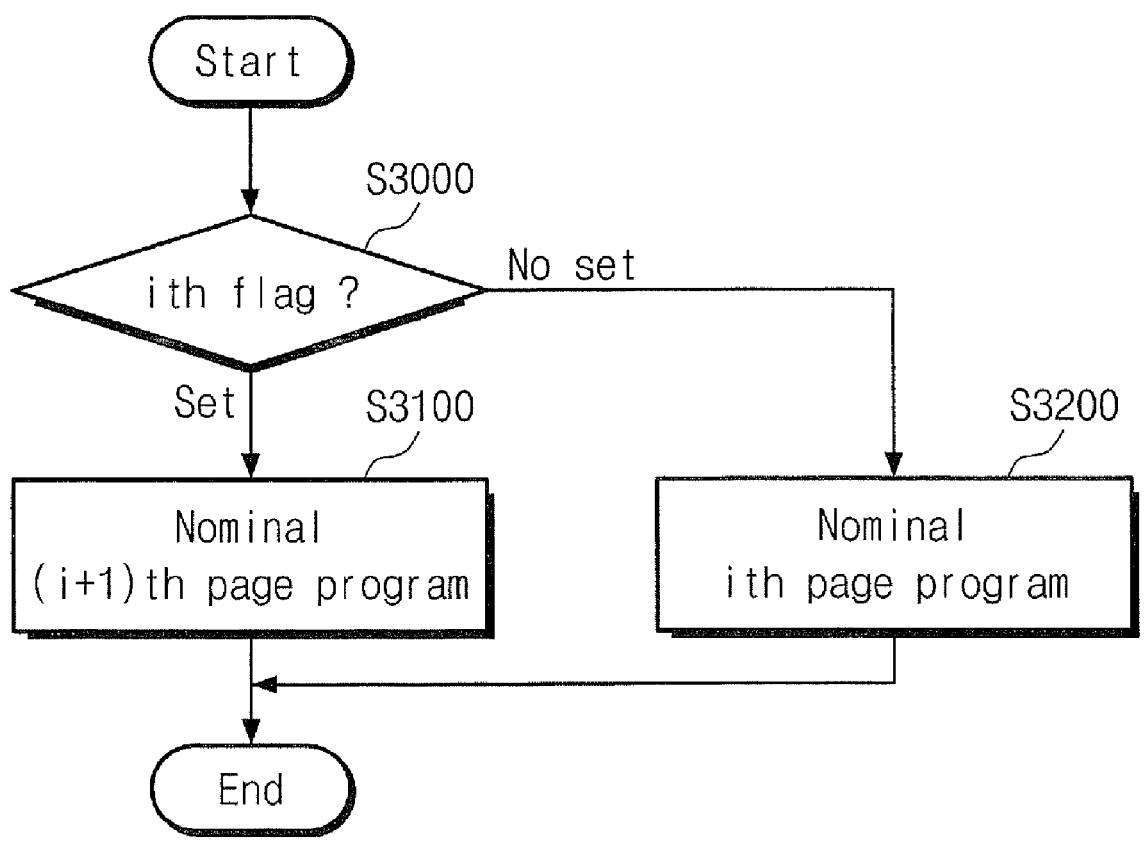
FIG. 10 is a flow chart illustrating a program method according to a third embodiment of the present invention.
Figure 11:
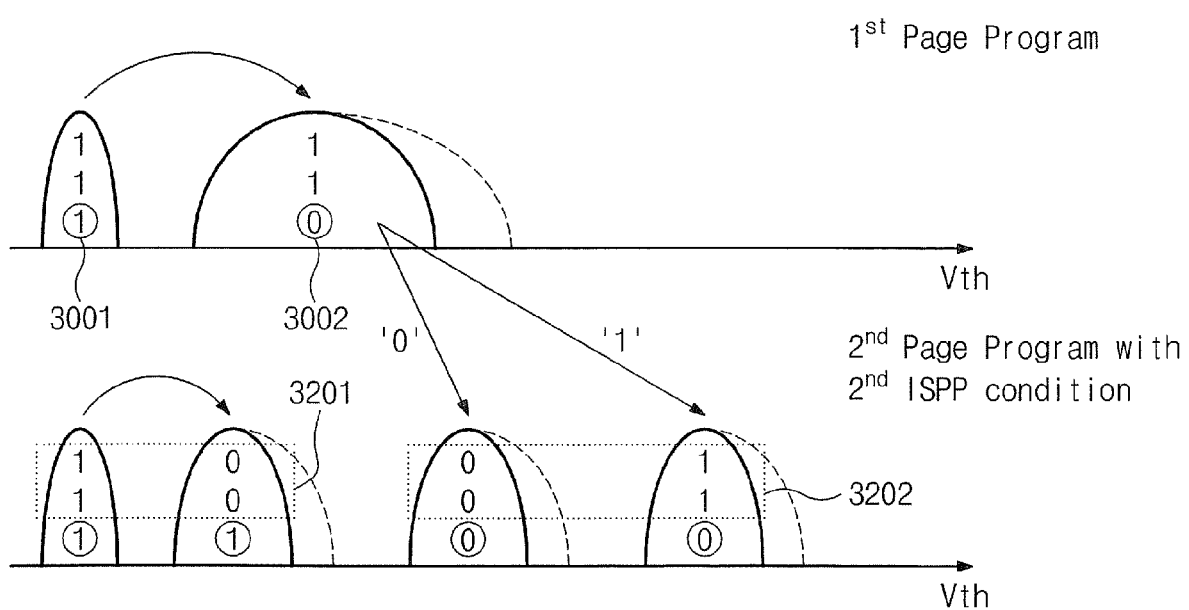
FIG. 11 illustrates a transition of program state according to method of program of FIG. 10.

FIG. 10 is a flow chart illustrating a program method according to a third embodiment of the present invention. FIG. 10 is an example of a method of programming $(i+1)^{th}$ bit according to whether program of the $i^{th}$ bit is performed or not performed in a multi-level cell. FIG. 11 illustrates a transition of program state according to method of program of FIG. 10. FIG. 11 is an example of transition in program state for a $3^{rd}$ bit according to the first embodiment of the present invention, in case the program of a $2^{nd}$ bit of a 3 bit multi-level cell is skipped. Program and read characteristics which will be described below are not limited to a 3-bit multi-level cell, but may also be applied to other various forms of multi-level cells.

Referring to FIG. 10, the method of programming a flash memory device according to the present invention is to initially check a state of a flag cell that corresponds to an $i^{th}$ bit (e.g. $2^{nd}$) of the selected memory cell, when performing a program for $(i+1)^{th}$ bit (S3000). As a result of identification at the step S3000, if the flag information FL corresponding to the $i^{th}$ bit of the selected memory cell is set at a predetermined value, a $(i+1)^{th}$ (e.g. $3^{rd}$) page program algorithm is performed (S3100). At the step S3100, ISPP program conditions for a normal $(i+1)^{th}$ page program algorithm are applied. In this case, the program operation for a middle bit is not skipped, therefore, the program state transitions in steps as illustrated in FIG. 4.

As a result of identification at the step S3000, if the flag information FL corresponding to the $i^{th}$ bit (e.g. $2^{nd}$) of the selected memory cell is not set at a predetermined value, the program condition is set in an ISPP program condition for the $i^{th}$ page program algorithm (S3200). The ISPP program condition may be varied or modified into various forms according to external (e.g. memory controller) or internal (e.g. control circuit 150) control. Then the $i^{th}$ (e.g. $2^{nd}$) page program algorithm is performed by using the program condition set in the step S3200 (S3300). The data used in program of the step S3300 is the data loaded at page buffer to be programmed at the $(i+1)^{th}$ bit. According to this program method, the data loaded to be programmed at the $(i+1)^{th}$ bit are programmed at all of the $(i+1)^{th}$ bit and $i^{th}$ bit of the selected memory cell (see 3201 and 3202 of FIG. 11). As a result, the $(i+1)^{th}$ bit and $i^{th}$ bit have equal values, and the $(i-1)^{th}$ bit value maintains the previous program state (see 2001 and 3002 of FIG. 11).

According to the above program method of the present invention, the $(i+1)^{th}$ bit of the selected memory cell is programmed using the ISPP condition for an $i^{th}$ page program algorithm. In this case, the $(i+1)^{th}$ bit to be programmed is programmed to a desired value, but its program state is transitioned so as to correspond to the program state of the program algorithm. Accordingly, the data value of the programmed $(i+1)^{th}$ bit is read by using the voltage used when reading the $i^{th}$ bit during a normal read operation. The adjustment of read voltage may be modified in various forms according to external (e.g. memory controller) or internal (e.g. control circuit 150) control.

Figure 12:
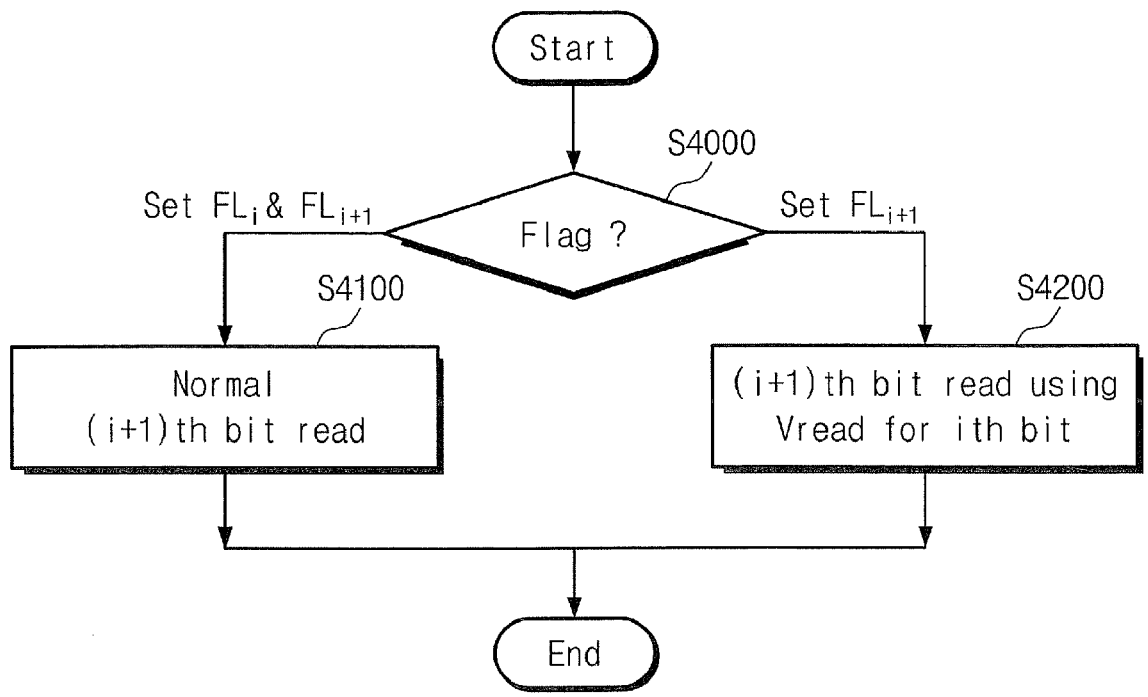
FIG. 12 is a flow chart illustrating a method of reading an $i+1^{th}$ bit value programmed according to the method of FIG. 10.

FIG. 12 is a flow chart illustrating a method of reading a $(i+1)^{th}$ bit value programmed according to the method of FIG. 10. The read method illustrated in FIG. 12 is shown as a flow chart of a normal read method for a $(i+1)^{th}$ bit of a programmed multi-level cell.

Referring to FIG. 12, in order to read an $i+1$th bit value at a selected memory cell, the state of the flag cells are checked, the state of the flag cells ($FL_{i+1}$, $FL_i$) corresponding to the bit to be read (i.e. $(i+1)^{th}$ bit) and the most previous bit (i.e. $i^{th}$ bit) (S4000). As a result of identification at the step S4000, if the flag cell state $FL_{i+1}$, $FL_i$ corresponding to the $i+1^{th}$ bit and $i^{th}$ bit are all set at predetermined values, a normal read operation for the $(i+1)^{th}$ bit is performed without modifying in the read voltage (S4100).

As a result of identification at the step S4000, if the flag cell state $FL_{i+1}$ corresponding to the $(i+1)^{th}$ bit is set at a predetermined value (i.e. if the flag cell state $FL_i$ corresponding to the $i^{th}$ bit, which is the most previous bit is not set), the read voltage is re-set as a normal read voltage for the $i^{th}$ bit, then using this, a read operation for the $(i+1)^{th}$ bit is performed (S4200). According to this data read operation, it is possible to perform an accurate data read operation.

Figure 13:
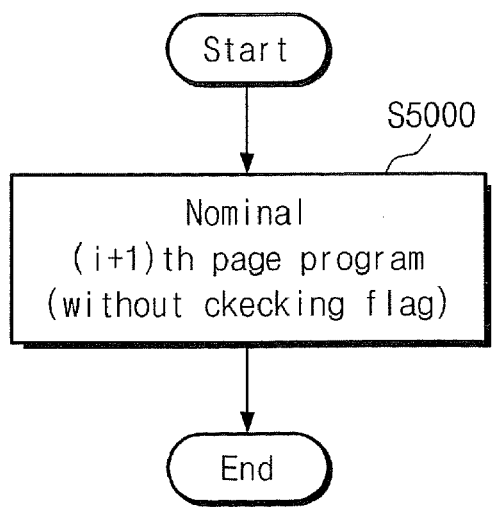
FIG. 13 is a flow chart illustrating a program method according to a fourth embodiment of the present invention.
Figure 14:
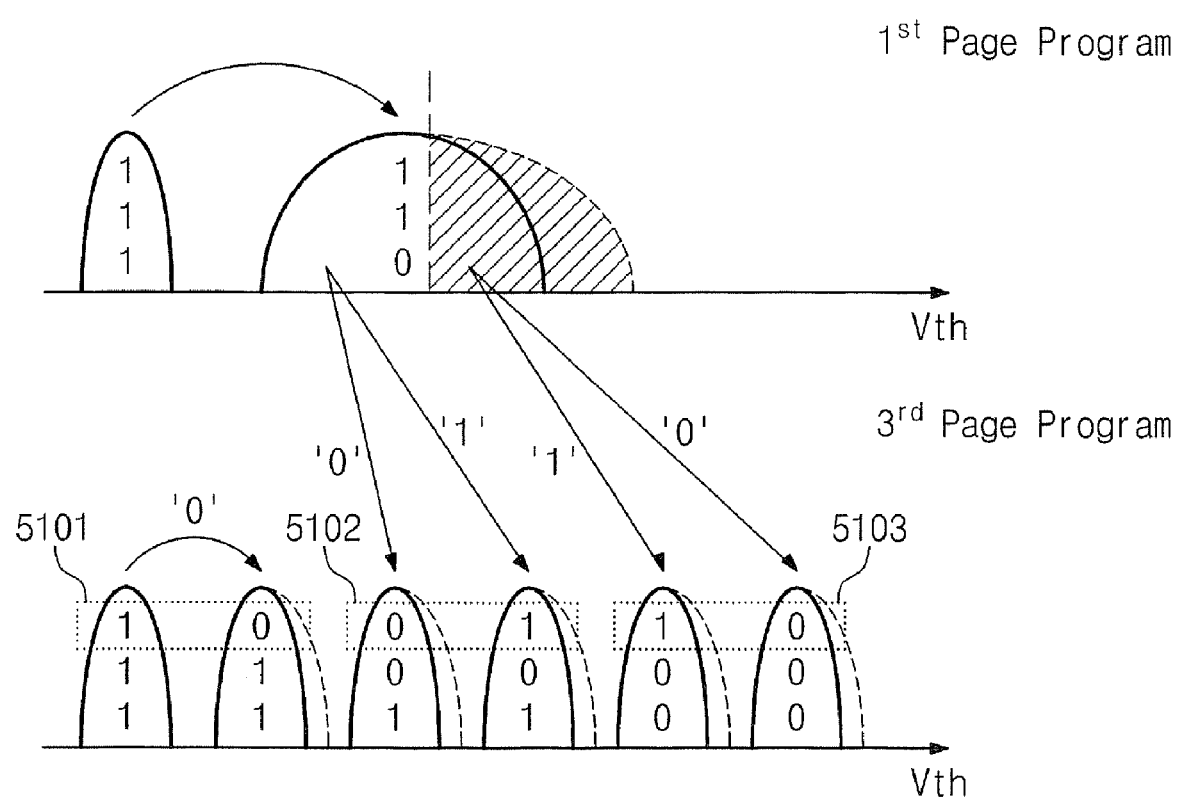
FIG. 14 illustrates a transition of program state of a memory cell according to the program method of FIG. 13.

FIG. 13 is a flow chart illustrating a program method according to a fourth embodiment of the present invention. FIG. 13 is an example of a program method for a $(i+1)^{th}$ bit. FIG. 14 illustrates a transition of program state of a memory cell according to the program method of FIG. 13. FIG. 14 illustrates an example of transition in program state for a $3^{rd}$ bit according to the fourth embodiment of the present invention, in case a program for a $2^{nd}$ bit is skipped at a 3-bit multi-level cell.

Referring to FIG. 13 and FIG. 14, the program method of a flash memory device according to the present invention is to perform directly a program for a $(i+1)^{th}$ bit without regard to whether a program for the previous bit of a selected memory cell (e.g. $2^{nd}$ bit) is performed or not, during performing a program for a $(i+1)^{th}$ bit (e.g. $3^{rd}$ bit) (S5000). In this case, an additional adjustment of the program voltage is not done, and the same ISPP program condition required at the present program algorithm (i.e. $(i+1)^{th}$ page program algorithm) is used. The program state transition is shown in 5101 to 5103 of FIG. 14.

After the $(i+1)^{th}$ page program algorithm is performed, a flag information FL corresponding to the flag cell is determined. This set operation of the flag information FL is performed as in the case of the page program algorithm performed previously. For example, in case the $i^{th}$ bit of the selected memory cell is programmed, the flag information FL will be set as a predetermined value (e.g. '1' or '0') in the corresponding flag cell. If the $i^{th}$ bit of the selected memory cell is not programmed, the flag information FL will not be set in the corresponding flag cell.

According to the program method of the present invention, in case a program for a $2^{nd}$ bit is skipped, a program state dispersion of a $3^{rd}$ bit will differ from the program state dispersion of FIG. 4. However, even if the program state dispersion has been altered, value programmed at a $(i+1)^{th}$ bit may be read accurately if the read voltage is adjusted according to whether program for the previous bit has been performed. Therefore, when a read operation for the bit programmed using the above characteristic is performed, the read voltage of the bit to be read at present is adjusted according to whether the program is performed for the previous bit. The read voltage may be modified in various forms according to external (e.g. memory controller) or internal (e.g. control circuit 150) control.

Figure 15:
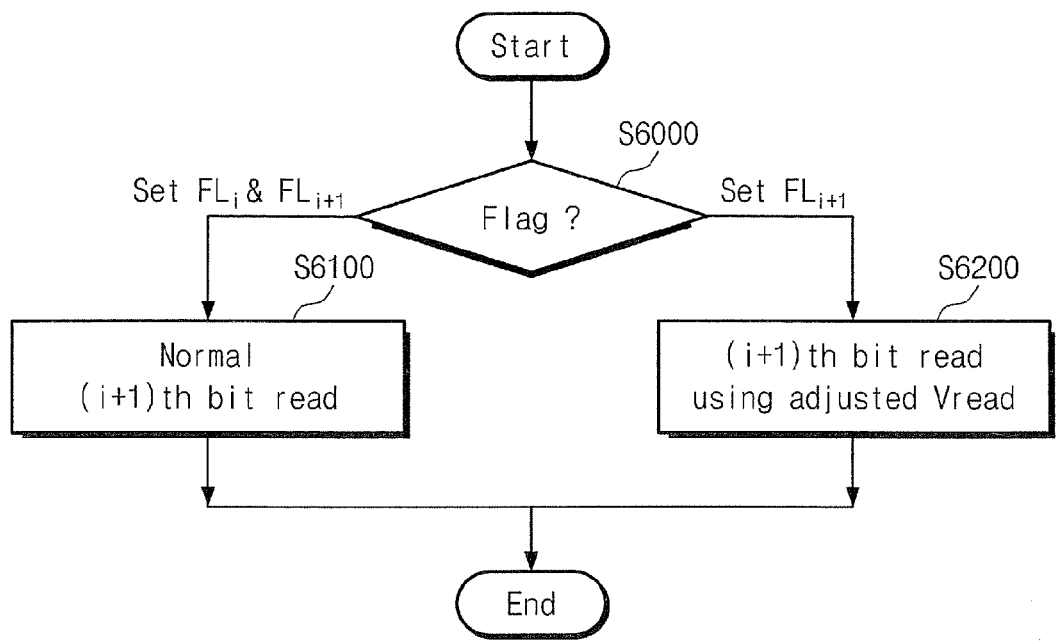
FIG. 15 is a flow chart illustrating a read method of an $i+1^{th}$ bit value programmed according to the method illustrated in FIG. 13.

FIG. 15 is a flow chart illustrating a read method of a $(i+1)^{th}$ bit value programmed according to the method illustrated in FIG. 13. The read method of FIG. 15 is shown in a flow chart of a normal-read method for a $(i+1)^{th}$ bit of a programmed multi-level cell.

Referring to FIG. 15, in order to read an $i+1$th bit value at a selected memory cell, the state of the flag cells are checked, the state of the flag cells ($FL_{i+1}$, $FL_i$) corresponding to the bit to be read (i.e. $(i+1)^{th}$ bit) and the most previous bit (i.e. $i^{th}$ bit) (S6000). As a result of identification at the step S6000, if the flag cell state $FL_{i+1}$, $FL_i$ corresponding to the $i+1^{th}$ bit and $i^{th}$ bit are all set at predetermined values, a normal read operation for the $i+1^{th}$ bit is performed without modifying in the read voltage (S6100). In this case, the same normal read voltage defined to read the $(i+1)^{th}$ bit is used.

As a result of identification at the step S6000, if the flag cell state $FL_{i+}$ corresponding to the $(i-1)^{th}$ bit is set at a predetermined value (i.e. if the flag cell state $FL_i$ corresponding to the $i^{th}$ bit, which is the most previous bit is not set), the read operation for the $i+1$th bit is performed using the read voltage set so as to correspond to the program state of FIG. 15 (S6200). The read voltage level is defined according to the program state illustrated in FIG. 14. According to programming method and reading method illustrated in FIGS. 13 to 15, as programs may be performed by uniform control method without regard to whether the program for a middle bit is skipped during the program operation, the control system of the program operation is simple. In addition, as the read voltage of the bit to be read at present is adjusted according to whether the program for the previous bit is performed or not, an accurate data read operation is possible.

Figure 16:
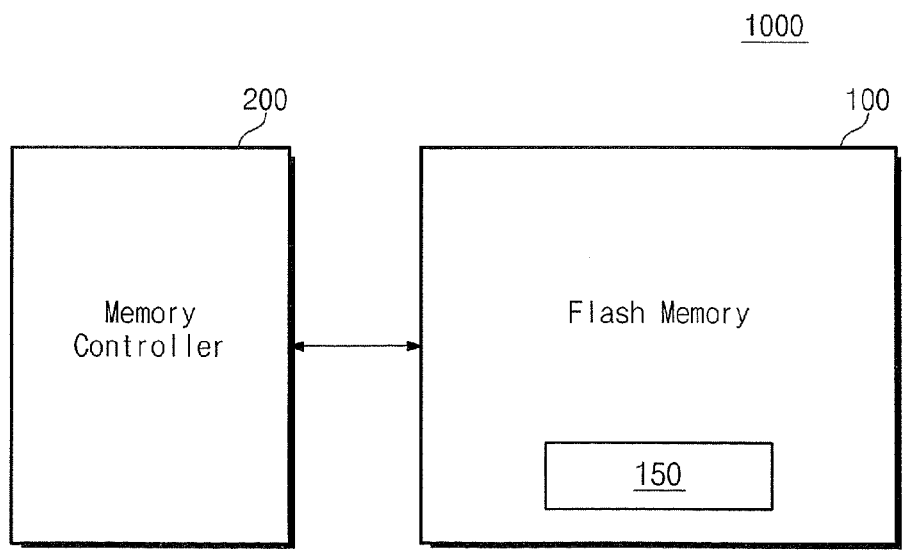
FIG. 16 illustrates a memory system including the flash memory device of the present invention of FIG. 1.

FIG. 16 illustrates a memory system 1000 including the flash memory device 100 of the present invention of FIG. 1.

Referring to FIG. 16, the memory system 1000 of the present invention includes a flash memory device 100 and a memory controller 200. The configuration of the flash memory device 100 is substantially identical to that of FIG. 1. Therefore, description of the same configuration will be omitted for brevity. The memory controller is configured so that it controls the flash memory device 100. The flash memory device 100 is configured to perform program and/or read operation according to one of the program methods, and according to one of the read methods, described above. The program voltage and read voltage to be used in program and reading are selected by control at the control circuit 150 in the memory controller 200 or in the flash memory device 100. The program voltage and read voltage to be used in program or reading, are determined by control at the control circuit 150 in the memory controller 200 according to whether the program for each bit performed at the selected memory cells are performed or not. Whether or not the program operation is done or not at each bit of the selected memory cells is determined using flag information FL stored in flag cells.

The flash memory system 1000 of FIG. 16 may include a memory card and/or memory card system. In this case, the memory controller 200 may be configured to be able to communicate with an external source (e.g. a host) through one of various interface protocols, for example, USB, MMC, PCI-E, ATA (Advanced Technology Attachment), Serial-ATA, Parallel-ATA, SCSI, SAS(Serial Attached SCSI), ESDI, and IDE (Integrated Drive Electronics). As is well-known, a flash memory device is a non-volatile memory device which is capable of retaining the stored data even in case power supply is stopped. Due to this characteristic, a flash memory device is used more widely not only as data storage but also as code storage to store information that must be preserved without regard to whether or not power supply is maintained or stopped. The flash memory device having such characteristic may be used in mobile devices, for example, cellular phone, PDA digital camera, portable game console, or MP3P, and also may be used in home applications, for example, HDTV, DVD, router, or GPS.

Figure 17:
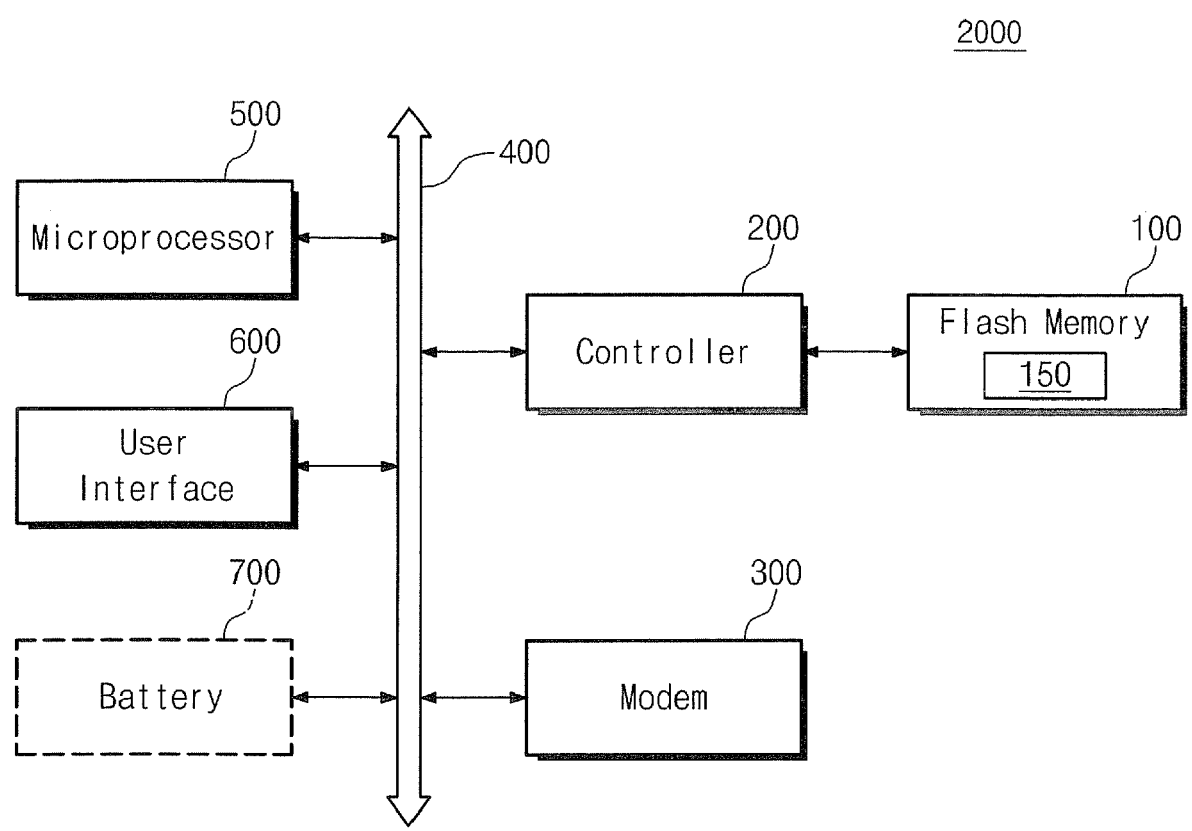
FIG. 17 illustrates a computing system including the flash memory device of the present invention.

FIG. 17 illustrates a computing system including the flash memory device 100 of the present invention.

Referring to FIG. 17, the computing system 2000 of the present invention includes a flash memory device 100 electrically connected to a bus 400, and a memory controller 200, a modem 300, e.g. a baseband chipset, microprocessor 500, and a user interface 600. The flash memory device 100 of FIG. 17 is configured substantially identical to that illustrated in FIG. 1. N-bit data (N is 1 or a larger positive number) processed or to be processed by the microprocessor 500 is stored by means of the memory controller at the flash memory device 100.

The flash memory device 100 is configured so at to perform a program or read operation according to one of the program methods, and one of the reading program methods, described above. The program voltage and read voltage to be used in program and reading are selected by control at the control circuit 150 in the memory controller 200 or in the flash memory device 100. The program voltage and read voltage to be used in program or reading, are determined by control at the control circuit 150 in the memory controller 200 according to whether the program for each bit performed at the selected memory cells are performed or not. Whether or not the program operation is done or not at each bit of the selected memory cells is determined using flag information FL stored in flag cells.

If the computing system according to the present invention is for a mobile device, an additional battery 700 for supplying operation voltage of the computing system may be provided. Although not shown in drawing, it should be obvious to persons in the art that further devices, for example, application chipset, camera image processor (CIS), or mobile DRAM may be provided in the computing system according to the present invention. The memory controller 200 and flash memory device 100 may form, for example, a SSD (Solid State Drive/Disk) using non-volatile memory for storing data.

The flash memory device and/or memory controller according to the present invention may be mounted using various forms of packages. The flash memory device and/or memory controller of the present invention may be mounted using packages, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP). In an exemplary embodiment of the present invention, the memory cells may be realized using one of the various cell structures having charge storage layer. It should be obvious to persons in the art that the cells structure having charge storage layer includes a charge trap flash structure using charge trapping layer, a stack flash structure in which a plurality of arrays are stacked in layers, a flash structure not including source/drain, and pin-type flash structure.

As described above, even in case a program operation for at least one bit of the multi-bit data programmed at a multi-level cell (MLC) is skipped, a program for the next bit may be accurately performed without influence.

In addition, as read operation is controlled according whether program is performed to each of the multi-bit data programmed at the multi-level cell (MLC), a read operation for the next bit may be accurately performed, even in case a program operation for at least one bit of the multi-bit data programmed at a multi-level cell (MLC) is skipped.

Although the present invention has been described in connection with the embodiment of the present invention illustrated in the accompanying drawings, it is not limited thereto. Persons with skill in the art will recognize that embodiments of the present invention may be applied to other types of memory devices. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of programming a flash memory device configured to program a plurality of bits per unit cell, wherein a program condition of a selected bit is set according to whether a program for the most previous bit to the selected bit for programming is skipped or not skipped.

2. The method of claim 1, wherein the program condition comprises at least one of level of program voltage Vpgm, supply number of times of program voltage Vpgm, increased amount of voltage ($\Delta V$), or program voltage supply period, that may be applied to each program loop of an incremental step pulse programming (ISPP).

3. The method of claim 1, wherein the method of setting the program condition when programming an $i+1^{th}$ (i is a positive number) bit of the cell comprises:
- identifying flag information to determine whether program for $i^{th}$ bit for the cell is skipped or not skipped;
- applying a program condition for the $i+1^{th}$ bit program algorithm to program the $i+1^{th}$ bit of the cell, in case the program for the $i^{th}$ bit is not skipped; and
- programming uniformly a predetermined data at the $i^{th}$ bit, in case the program for the $i^{th}$ bit is skipped, and applying the program condition for the $i+1^{th}$ bit program algorithm to program the $i+1^{th}$ bit of the cell.

4. The method of claim 3, wherein a normal read voltage of the $i+1^{th}$ bit is applied to the programmed $i+1^{th}$ bit.

5. The method of claim 1, wherein the method of setting the program condition when programming an $i+1^{th}$ (i is a positive number) bit of the cell comprises:
- identifying flag information to determine whether program for an $i^{th}$ bit of the cell is skipped or not skipped;
- applying a program condition for the $i+1^{th}$ bit program algorithm to program the $i+1^{th}$ bit of the cell, in case the program for the $i^{th}$ bit is not skipped; and
- applying the program condition for the $i+1^{th}$ bit program algorithm to program the $i+1^{th}$ bit of the cell, in case the program for the $i^{th}$ bit is skipped.

6. The method of claim 5, the $i+1^{th}$ bit is programmed through $i+1^{th}$ page program algorithm, in case the $i^{th}$ bit program is not skipped, and the $i+1^{th}$ bit is programmed through ith page program algorithm, in case the ith bit program is skipped.

7. The method of claim 5, wherein the programmed $i+1^{th}$ bit is read by using a normal read voltage for the $i+1^{th}$ bit.

8. The method of claim 5, wherein the $i^{th}$ bit is programmed to the identical value with the $i+1^{th}$ bit, in case the program for the $i^{th}$ bit is skipped.

9. The method of claim 5, wherein the programmed $i+1^{th}$ bit is read by using normal-read voltage for the ith bit, in case the program for the $i^{th}$ bit is skipped.

10. The method of claim 1, wherein the method of setting the program condition when programming the $i+1^{th}$ (i is a positive number) bit of the cell comprises:
- applying the program condition of the $i+1^{th}$ bit program algorithm to program the $i+1^{th}$ bit of the cell, without regard to whether program of the $i^{th}$ bit of the cell is skipped or not skipped, wherein the $i+1^{th}$ page program algorithm is performed at the cell.

11. The method of claim 10, wherein the programmed $i+1^{th}$ bit is read using the normal-read voltage for the $i+1^{th}$ bit, in case the $i^{th}$ bit program is not skipped, and the programmed $i+1^{th}$ bit is read using the read voltage defined to correspond to the program state of the $i+1^{th}$ bit, in case the programming of the $i^{th}$ bit is skipped.

12. A method of programming a flash memory device configured to program a plurality of bits per unit cell, and a read voltage of a selected bit is set according to whether a program for the most previous bit to the selected bit for programming is skipped or not skipped.

13. The method of claim 12, wherein the method of setting the program condition when programming an $i+1^{th}$ (i is a positive number) bit of the cell comprises:
- identifying flag information to determine whether program for an bit of the cell is skipped or not skipped;
- setting the normal-read voltage of the $i+1^{th}$ bit to a read voltage of the $i+1^{th}$ bit of the cell, in case the program for the $i^{th}$ bit is not skipped; and
- setting the normal-read voltage of the $1^{th}$ bit to a read voltage of the $i+1^{th}$ bit of the cell, in case the program for the $i^{th}$ bit is skipped.

14. The method of claim 12, wherein the method of setting the program condition when programming an i+1th (i is a positive number) bit of the cell comprises:
- identifying flag information to determine whether program for an $i^{th}$ bit of the cell is skipped or not skipped;
- setting the normal-read voltage of the $i+1^{th}$ bit to a read voltage of the $i+1^{th}$ bit of the cell, in case the program for the bit is not skipped; and
- setting the read voltage defined to correspond to the program state of the $i+1^{th}$ bit to the read voltage of the $i+1^{th}$ bit of the cell, in case the program for the $i^{th}$ bit is skipped.

* * * * *